US006686639B1

(12) United States Patent
Tsai

(10) Patent No.: US 6,686,639 B1
(45) Date of Patent: Feb. 3, 2004

(54) HIGH PERFORMANCE MEMS DEVICE FABRICATABLE WITH HIGH YIELD

(75) Inventor: Chialun Tsai, Thousand Oaks, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/260,662

(22) Filed: Sep. 30, 2002

(51) Int. Cl.$^7$ ............................................. H01L 29/84
(52) U.S. Cl. ................................................... 257/415
(58) Field of Search ........................... 257/415, 417, 257/418

(56) References Cited

U.S. PATENT DOCUMENTS

| 5,640,133 | A | * | 6/1997 | MacDonald et al. | 333/197 |
| 6,200,882 | B1 | * | 3/2001 | Drake et al. | 438/464 |
| 6,497,141 | B1 | * | 12/2002 | Turner et al. | 73/105 |
| 6,500,760 | B1 | * | 12/2002 | Peterson et al. | 438/684 |
| 6,593,677 | B2 | * | 7/2003 | Behin et al. | 310/309 |

* cited by examiner

Primary Examiner—Allan R. Wilson

(57) ABSTRACT

A MEMS device with a electrostatic comb actuator is comprised of a supporting substrate, with device features on only one side, and two silicon device layers locally bonded together by thermal compression bonding of metal pads. Use of a supporting substrate enables the silicon device layers to be relatively thin and eliminates the through-wafer etch procedure, which greatly reduces silicon etch times and improves the accuracy and yield of the etch processes. Use of metal-metal interlayer bonds avoids the need for a wet chemical etch for release of the moveable structure so that the device can be fabricated with high yield. Scanning micromirror devices according to the present invention were fabricated with almost 100% yield and exhibited scanning over a 12° optical range and a mechanical angle of $\pm 3°$ at a high resonant frequency of 2.5 kHz with an operating voltage of only 20 VDC.

21 Claims, 5 Drawing Sheets

PRIOR ART

HIGH PERFORMANCE MEMS DEVICE FABRICATABLE WITH HIGH YIELD

CROSS-REFERENCE TO RELATED APPLICATIONS

This application is related to application Ser. No. 10/260,250 of Chialun Tsai entitled "Process for High Yield Fabrication of a MEMS Device", which is being filed on the same date as this application and is assigned to the same assignee.

BACKGROUND OF THE INVENTION

1. Field of the Invention

This invention is concerned with micro-electromechanical systems (MEMS) and in particular with high-performance MEMS devices with comb actuators.

2. Description of the Related Art

Micro-electro-mechanical systems (MEMS) fabricated from single crystal silicon by anisotropic etching are widely used for sensors (accelerometers, for example) and are of increasing commercial interest and importance for use in a variety of active devices, such as electrical switches, variable capacitors and inductors, and micromirrors for optical scanning and switching. A typical MEMS active device comprises a functional element that is anchored by a spring or hinge but suspended above a substrate so that it can be moved by an actuator, such as a capacitively driven comb structure. The moveable functional element might be a switch contact, capacitor plate or micromirror, for example. In addition to the small size desirable for portable equipment, MEMS devices offer the potential for faster response times, lower power consumption and reduced costs. Large cost benefits can be provided if the yield of functional devices per processed wafer is high.

An important potential application for MEMS is scanning mirrors, which are used in a wide variety of measurement and communications equipment including barcode readers, laser printers, confocal microscopes and fiber-optic networks. Compared to macro-scale scanning mirrors, MEMS micromirrors offer faster scanning speed, lower power consumption and reduced cost, and are enabling with respect to many new technologies. In particular, scanning micromirrors with high frequency optical switching capability are critical to development of advanced telecommunications systems.

The state of the art for design of active MEMS devices is illustrated by the scanning micromirror device with a comb actuator described in a recent publication (R. A. Conant, J. T. Lee, N. Y. Lau and R. S. Muller, p. 6, Proc. Solid-State and Actuator Workshop, Hilton Head Island, S.C., Jun. 4–8, 2000). For this device, one silicon layer comprises a coplanar circular mirror (550 $\mu$m diameter) and a moveable comb actuator suspended via a silicon torsion spring, which is connected to a stationary anchor. A second silicon device layer comprises a stationary comb structure whose teeth are immediately below the spaces between the teeth in the moveable comb. Capacitive charging of the teeth on the two combs by an applied voltage produces a force of attraction that tends to move the moveable comb and the attached micromirror, which are returned to their original positions by the torsion spring when the voltage is removed. In this prior art micromirror design, mechanical support for the device is provided by the device layer containing the stationary comb structure so that this layer must be relatively thick. Also, the two device layers are bonded together via a silicon oxide layer, which must be partially removed in one of the final steps of fabrication to release the moveable structure. This silicon oxide layer between the two device layers is formed during a fusion bonding process that operates at high temperature (1100° C.).

This prior art design, which is typical of prior art MEMS devices, has several significant disadvantages. For example, a hole must be etched through the thick support device layer to provide access to the micromirror, which greatly increases the processing time (3–5 hours), reduces the etching accuracy, and requires use of thicker photoresist with reduced feature resolution. Furthermore, the wet chemical etch required for release, typically hydrofluoric acid (HF) or buffered oxide etch (BOE), is difficult to control and greatly reduces the yield of useable devices. In addition to requiring a high processing temperature, the silicon-oxide-silicon bonding process is very sensitive to particulates so that the wafers must be handled in at least a Class 10 cleanroom environment. Also, the presence of deep etched features on both sides of the device complicates photolithographic processing and increases the likelihood of damage during handling. Likewise, use of the stationary comb silicon layer as one of the electrical connections limits options for device integration and in some cases may necessitate extra processing to electrically ground or connect floating elements. These disadvantages of prior art MEMS devices reduce the precision of alignment between the stationary and moveable comb structures, which further reduces the device yield and necessitates use of excessively high actuator voltages. Although typical of the prior art MEMS fabrication processes, all of these disadvantages may not apply equally to every device and every fabrication process.

SUMMARY OF THE INVENTION

The present invention provides a MEMS device with two silicon device layers. The first silicon device layer comprises a stationary actuator comb structure (with an electrical contact area) and bond pads, which are disposed on an insulating layer (preferably, silicon oxide) on a substantially continuous substrate layer (preferably, silicon). The second device layer comprises a moveable functional device element and a moveable actuator comb structure connected via at least one silicon spring to stationary silicon bond pads. Mating bond pads on the two silicon device layers are bonded together (preferably by thermal compression bonding) via a metal layer, which is preferably comprised of an adhesion layer (chromium, titanium, nickel or cobalt, for example) and a gold layer. A voltage applied between the actuator structures on the two silicon layers tends to cause the moveable comb structure and functional device element to move relative to the stationary bond pads, and the spring tends to restore them to their original positions in the absence of applied voltage. Voltages are applied via electrical contacts to the actuator structures, which preferably comprise metallic contact pads and wire bonds. Devices according to the present invention have device features on only one side of the device.

The device of the present invention offers significant advantages compared to prior art MEMS devices. Use of a supporting substrate enables the silicon device layers to be relatively thin, which greatly reduces silicon etch times. In addition to reducing costs, short silicon etch times improve the accuracy and yield of the etch processes and permit use of high resolution photoresists providing higher feature resolution. Use of metal-metal interlayer bonds avoids the need for a wet chemical etch for release of the moveable structure so that the device can be fabricated with high yield.

Metal-metal thermal compression bonding is also less sensitive to particulates, compared to the silicon-silicon oxide bonding of the prior art, and can be performed in a relatively low-quality cleanroom environment (Class 1000, for example). The device design of the present invention also enables precise alignment between the silicon device layers, and use of low-temperature metal-metal bonding minimizes thermal distortion of the device elements.

Scanning micromirror devices according to the present invention were fabricated with almost 100% yield and exhibited scanning over a 12° optical range and a mechanical angle of ±3° at a high resonant frequency of 2.5 kHz with an operating voltage of only 20 VDC. Comparable prior art MEMS scanning micromirror devices fabricated using a prior art process required 100 V for switching and were obtained in only about 20% yield. The present invention encompasses a wide variety of MEMS devices, including but not limited to electrical switches, variable capacitors and inductors, high frequency resonators, and micromirrors for optical scanning and switching. Further features and advantages of the invention will be apparent to those skilled in the art from the following detailed description, taken together with the accompanying drawings.

These figures are not to scale and some features have been enlarged for better depiction.

DETAILED DESCRIPTION OF THE INVENTION

Terminology used in this document is generally the same as that used in the art. Patterning typically involves applying a thin layer of photoresist, exposing the photoresist to radiation through a mask having a predetermined pattern, and dissolving the uncured photoresist in a solvent so as to permit removal of the underlying substrate material, usually by etching. The photoresist may be negative (cured by exposure to radiation) or positive (degraded by exposure to radiation), and may be applied as a liquid by spraying, dipping or spin coating, for example, or as a dry film. As known to those skilled in the art, MEMS fabrication typically involves anisotropic etching of single crystal silicon wafers using silicon oxide as an etch stop, or as an etch resistant layer to prevent etching of underlying silicon. Silicon etching may be performed by wet chemical methods or dry methods (plasma etching, for example). Depending on the etching conditions, silicon or silicon oxide may be selectively removed. A handle substrate imparts sufficient structural integrity to a silicon device layer for ease of handling and is ultimately removed. Handle substrates are typically silicon attached to the device layer via a silicon oxide layer, which serves as an etch stop during removal of the handle substrate.

Figure 1:
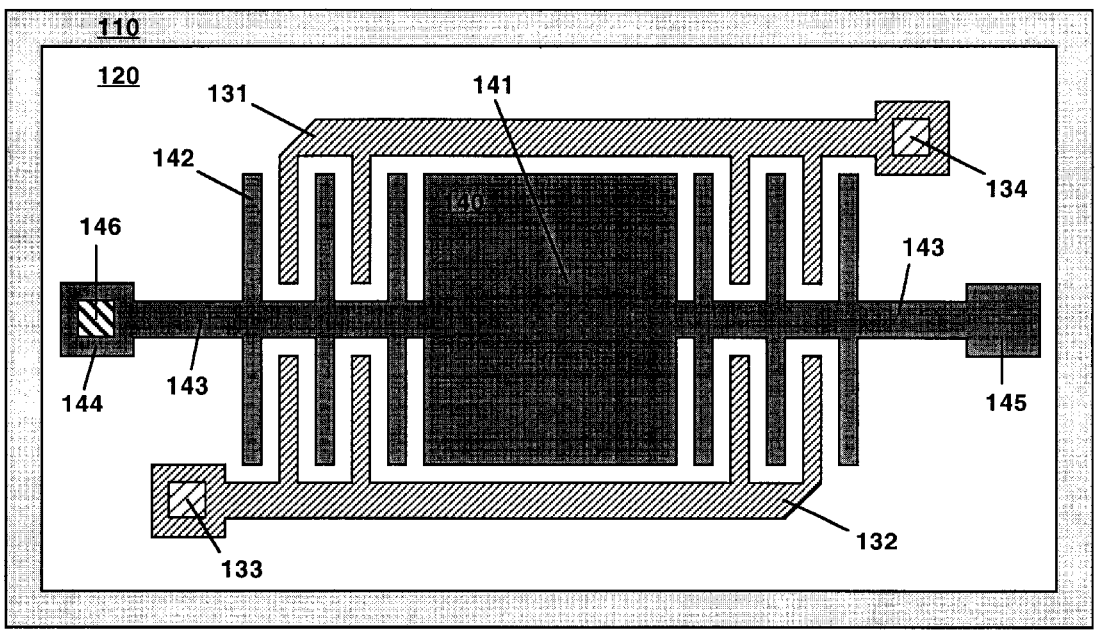
FIG. 1 is a schematic overhead view of a first type of torsion spring micromirror device according to the present invention.

FIG. 1 is a schematic overhead view of a representative type of torsion spring micromirror device according to the present invention. Each kind of shading represents a different layer of the device. Layer 110 is a supporting substrate that is preferably a continuous layer of silicon but may be discontinuous or comprised of another material, which may be an insulator, conductor or semiconductor. Layer 120 is preferably silicon oxide but may be another material of sufficient resistivity to provide substantial electrical isolation between the stationary comb structures 131 and 132, which are disposed in a first device layer upon insulating layer 120 and are electrically contacted separately. Electrical contacts to comb structures 131 and 132 are preferably made via wire bonds to metallic contact pads 133 and 134, respectively, but may be made by any suitable method. Layer 140 is a second silicon device layer comprising micromirror 141, comb teeth 142, torsion spring 143, and stationary bond pads 144 and 145. Micromirror 141, comb teeth 142 and torsion spring 143 comprise the moveable device structure which is supported by mating bond pads in the first device layer underneath bond pads 144 and 145 (see FIG. 2). Pads 144 and 145 are bonded to the mating pads in the first device layer by metal but are electrically isolated from stationary comb structures 131 and 132 via the portion of insulating layer 120 interposed between the mating pads in the first device layer and substrate 110. Electrical contact to the mirror-comb structure in device layer 140 is established via optional contact pad 146, which preferably comprises a metal. A voltage applied between contact pad 146 and contact pad 133 or 134 produces an attractive force between moveable comb teeth 142 and the teeth of stationary comb 131 or 132, respectively, that tends to cause micromirror 141 to rotate about the axis of torsion spring 143. When a voltage is not applied, spring 143 tends to return micromirror 141 to its original position.

Figure 2:
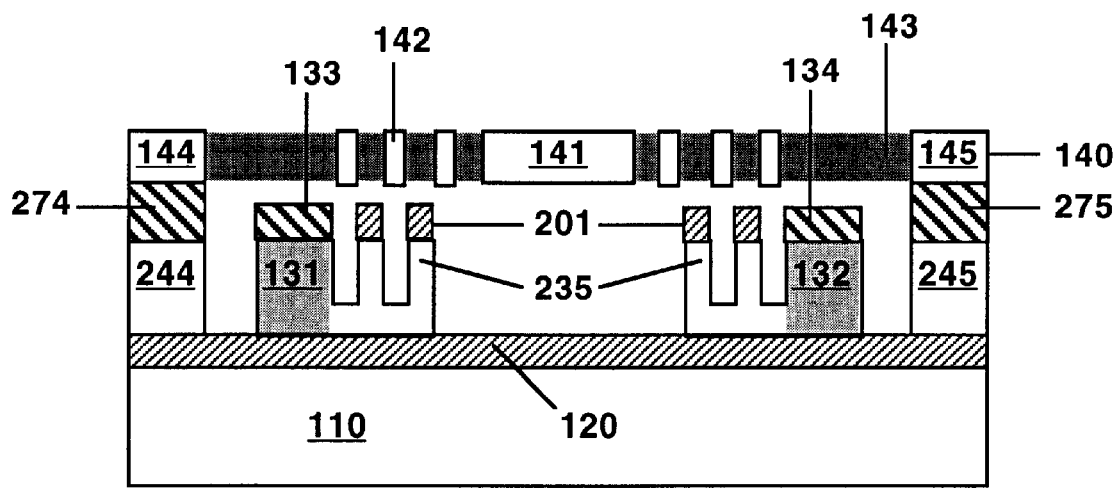
FIG. 2 is a schematic side view of the torsion spring micromirror device of FIG. 1.

FIG. 2 is a schematic side view of the torsion spring micromirror device depicted in FIG. 1. Numbering of the device features in the two figures is the same. Layer 120 is an insulating layer, preferably silicon oxide, that is disposed on supporting substrate 110, preferably silicon, and electrically isolates stationary comb structures 131 and 132 and silicon bond pads 244 and 245, which comprise the first device layer. The thickness of the first silicon device layer is preferably 50 $\mu$m for a scanning micromirror device but may vary significantly depending on the type and desired characteristics of the MEMS device fabricated. Only two comb teeth 235 are shown for each of stationary comb structures 131 and 132 but comb structures for actual devices generally have numerous teeth so as to increase the force generated by the actuator. Layer 201 disposed upon the outer surface of each of the comb teeth is preferably 2500 Å of silicon oxide applied by plasma enhanced chemical vapor deposition (PECVD) but may also be silicon oxide of a different thickness or applied by a different method, or may be comprised of a different material (a metal, for example) that is resistant to the silicon etchant used to process the second device layer 140. For the device illustrated schematically in FIG. 2, electrical contact pads 133 and 134 and the underlying portions of stationary comb structures 131 and 132, respectively, are located in different planes (as indicated by the difference in shading) compared to comb teeth 235 (see FIG. 1). Electrical contact pads 133 and 134 preferably comprise a wire-bondable metal to which a wire (not shown) is bonded by standard methods to establish electrical contact. Metal on pads 133 and 134 may also be used to protect the underlying silicon from the etchant used to process the second device layer 140.

As also depicted in FIG. 2, micromirror 141 and comb teeth 142 in second device layer 140 are suspended above the first device layer via torsion spring 143 (depicted as a shaded area since it is not in the same cross-sectional plane), which is connected to stationary bond pads 144 and 145. The thickness of silicon device layer 140 is preferably 20 µm for a scanning micromirror device but may vary significantly depending on the type and desired characteristics of the MEMS device fabricated. Pads 144 and 145 are bonded to respective bond pads 244 and 245 in the first device layer by metal bonds 274 and 275. Bonds 274 and 275 are preferably comprised of a gold layer sandwiched between adhesion layers of another metal (chromium, titanium, nickel or cobalt, for example), which provides good adhesion to silicon bond pads 144, 145, 244 and 245. For some adhesion layer metals (titanium, for example), a diffusion barrier layer of another metal (platinum, for example) may be needed. Gold is preferred for bonds 274 and 275 to enable pads 144 and 145 in second device layer 140 to be joined to respective pads 244 and 245 in the first device layer by thermal compression bonding at a low temperature (330° C.). Interlayer metal bonding is relatively insensitive to particulates and a low bonding temperature minimizes thermal distortion of the device. Suitable thicknesses for the chromium and gold layers on pads 144, 145, 244 and 245 for thermal compression bonding are 150 Å and 5000 Å, respectively, but other adhesion layers and/or other thicknesses may be used. Such gold layers (with suitable adhesion layers) are preferred for contact pads 133 and 134 since they are readily wire bonded and can be applied during metallization of bond pads 244 and 245. However, metallic contact pads are optional since wire bonds can be made directly to silicon. Contact pad 146 (FIG. 1) may be omitted (as in FIG. 2) to avoid an additional processing step. Resolution of comb teeth 142 and 235 (FIG. 2) and alignment between the moveable and stationary comb structures in the two device layers is critical to the performance and yield of devices fabricated from silicon wafers.

Figure 3:
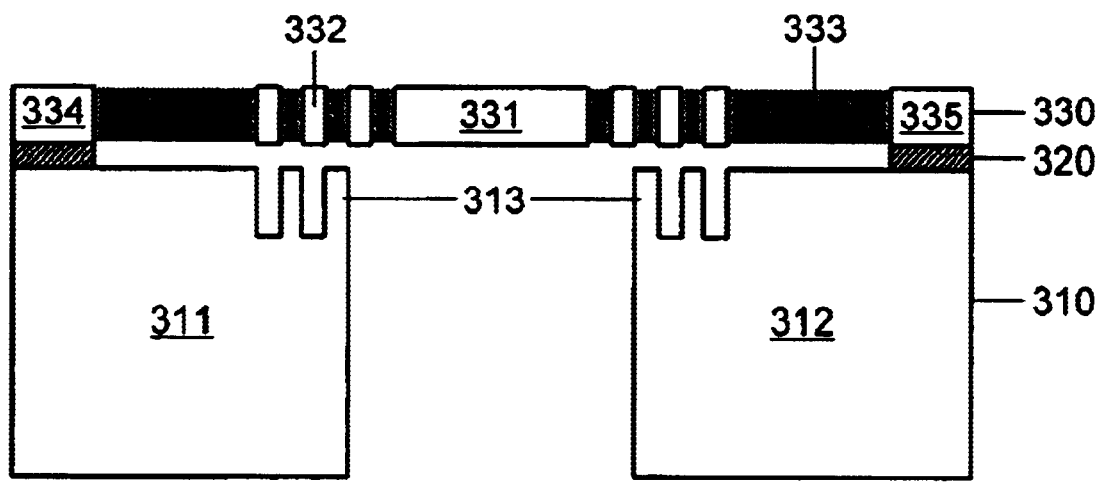
FIG. 3 is a schematic side view of a torsion spring micromirror device representative of the prior art.

For comparison, FIG. 3 shows a schematic side view of a torsion spring micromirror device representative of the prior art. First device layer 310, which comprises stationary actuator structures 311 and 312 with teeth 313, is bonded via silicon oxide layer 320 to stationary bond pads 334 and 335 in second device layer 330, which includes micromirror 331, moveable comb teeth 332 and torsion spring 333. This device design has significant disadvantages. Device layer 310 must be relatively thick since it provides mechanical support for the device so that formation of hole 340 requires a very long etch time of 3 to 5 hours, which is costly and results in reduced device yield. Also, during processing of second device layer 330, silicon oxide layer 320 is used as an etch stop to prevent etching of first device layer 310 and is present as a continuous layer. Removal of the silicon oxide material in layer 320 outside the interlayer bond areas requires a wet chemical etch (HF or BOE), which is difficult to control and is largely responsible for the low yield generally obtained for prior art devices. In addition, formation of silicon oxide layer 320 by silicon-oxide-silicon fusion requires a high temperature (>1000° C.) and is very sensitive to particulates, requiring a high quality cleanroom (at least a Class 10). These disadvantages are obviated for the device of the present invention.

A process for fabricating the device of the present invention is described in a related U.S. Patent Application of Chialun Tsai entitled "Process for High-Yield Fabrication of a MEMS Device", which is being filed on the same date as this application. The basic steps of a preferred embodiment of this process for fabrication of an active MEMS device are as follows. Alignment marks are etched into the surface of the first silicon device layer on a first silicon-on-insulator (SOI) wafer, which comprises a first etch stop layer (e.g., silicon oxide) sandwiched between the first silicon device layer and a supporting substrate (e.g., silicon). An etch resistant layer (e.g., silicon oxide) is applied to the first silicon device layer and is patterned and etched to expose silicon in predetermined contact and bond pad areas, which are selectively metallized by deposition of a metal layer (e.g., Cr/Au) and liftoff of the remaining photoresist and extraneous metal. The etch resistant layer is then patterned again and etched (preferably by dry oxide plasma etching) and the underlying silicon is etched (preferably by deep silicon plasma etching) to form the stationary actuator structure, which is protected from subsequent etching by the remaining etch resistant layer. Metallic contact pads spatially mated to those on the first device layer are formed on a second silicon device layer on a second SOI wafer, which comprises a second etch stop layer (e.g., silicon oxide) sandwiched between the second device layer and a handle substrate (e.g., silicon). The mating bond pads on the two wafers are aligned and bonded together by thermal compression bonding and the handle substrate and etch stop layer on the second wafer are removed. The overall thickness of metal bonds 274 and 275 (FIG. 2) determines the vertical spacing between the stationary and moveable actuator structures. Small areas on the second device layer are patterned and removed to expose at least two alignment marks on the first device layer, which are used for precise alignment of the mask for patterning the second device layer. The second device layer is patterned and etched to form the moveable actuator structure and functional device element, which are connected via a silicon spring to stationary silicon pads that serve as mechanical supports and electrical contacts. Electrical contacts are formed to the contact pads, by wire bonding, for example.

The description above utilized a micromirror device having a comb actuator with the moveable teeth connected to a torsion spring as an example. As would be evident to those skilled in the art, however, the device of the present invention encompasses a wide range of embodiments. For example, the fabricated micromirror device could have the moveable teeth connected to opposing sides of the mirror instead of to the torsion spring. In another micromirror configuration, four silicon springs attached to the corners of a rectangular mirror could replace the torsion spring arrangement to provide linear rather than rotational mirror motion. At least some of the device layers of the device of the present invention may be comprised of an alternative material to silicon, germanium, for example. Etch stop and etch resistant layers may also be comprised of alternative materials, germanium oxide, for example.

Figure 4:
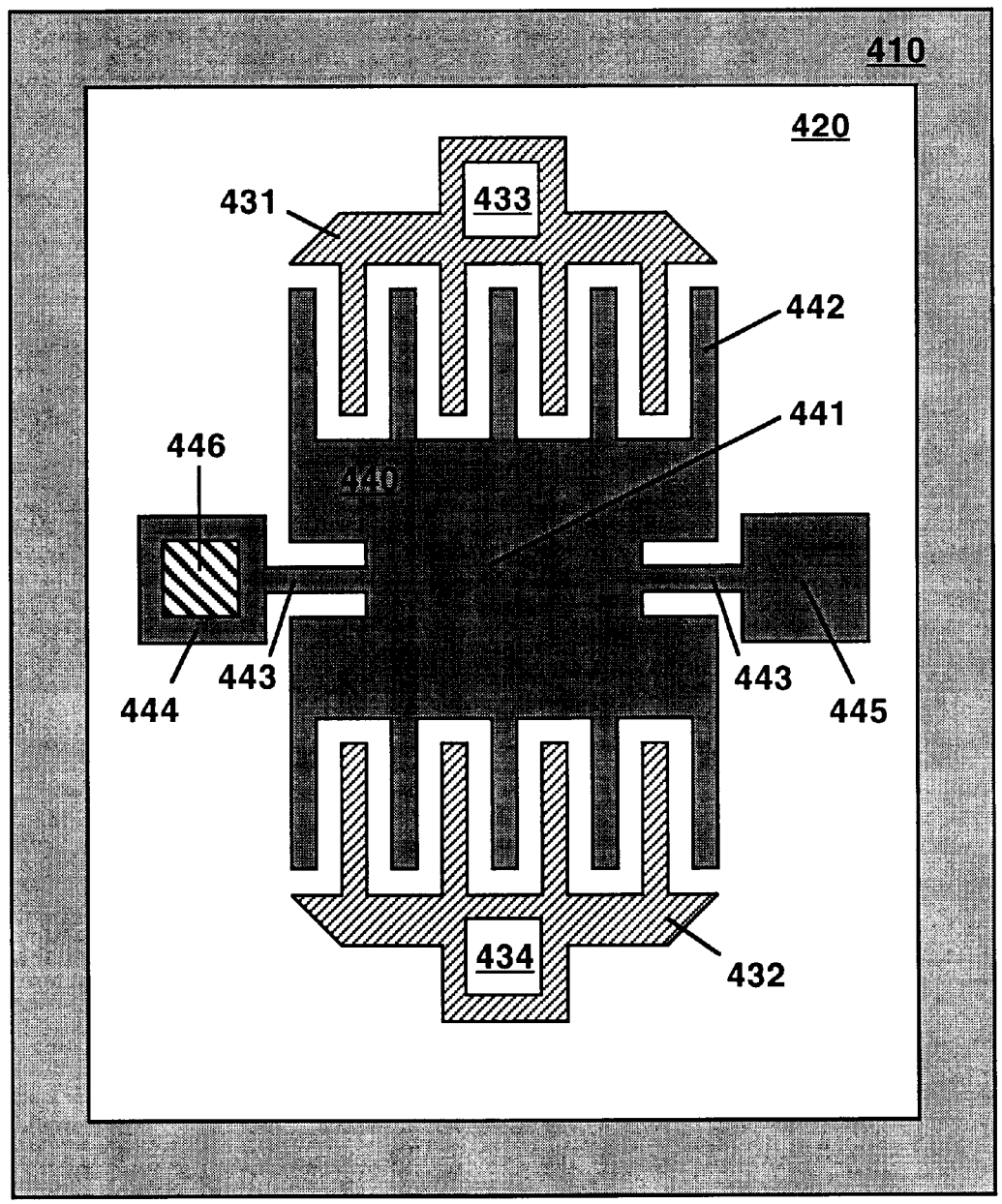
FIG. 4 is a schematic overhead view of a second type of torsion spring micromirror device according to the present invention.

FIG. 4 is a schematic overhead view of a torsion spring micromirror device according to the present invention having moveable comb teeth 442 in second device layer 440 connected to opposing sides of mirror 441 instead of to the torsion spring 443. As with the device of FIG. 1, torsion spring 443 is connected to stationary bond pads 444 and 445, which are bonded via a metal to mating bond pads in the first device layer (not shown). Layer 410 is a supporting substrate that is preferably a continuous layer of silicon and layer 420 is preferably silicon oxide. Electrical contacts to stationary comb structures 431 and 432 are preferably made via wire bonds to metallic contact pads 433 and 434, respectively. Electrical contact to the mirror-comb structure in device layer 440 may be established via optional contact pad 446, which preferably comprises a metal. A voltage applied between contact pad 446 and contact pad 433 or 434 produces an attractive force between moveable comb teeth 442 and the teeth of stationary comb 431 or 432, respectively, that tends to cause micromirror 441 to rotate about the axis of torsion spring 443. When a voltage is not applied, spring 443 tends to return micromirror 441 to its original position.

Figure 5:
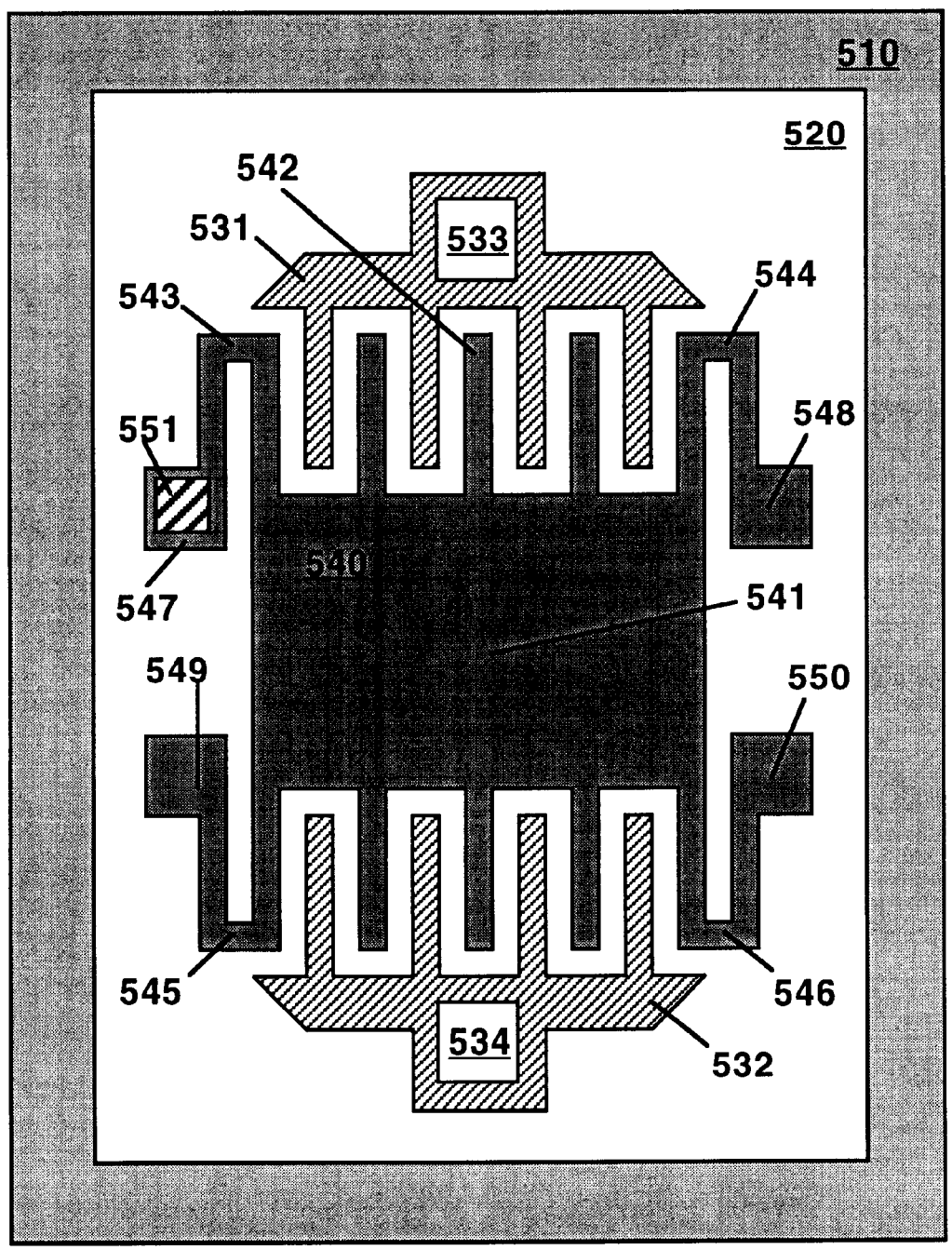
FIG. 5 is a schematic overhead view of a linear motion micromirror device according to the present invention.

FIG. 5 is a schematic overhead view of a micromirror device according to the present invention having a device layer 540 comprised of four silicon springs 543, 544, 545 and 546 attached to the corners of moveable rectangular mirror 541 and to stationary bond pads 547, 548, 549 and 550, which are bonded via a metal to mating bond pads in the first device layer (not shown). As with the device of FIG. 1, layer 510 is a supporting substrate that is preferably a continuous layer of silicon and layer 520 is preferably silicon oxide. Electrical contacts to stationary comb structures 531 and 532 are preferably made via wire bonds to metallic contact pads 533 and 534, respectively. Electrical contact to the mirror-comb structure in device layer 540 is established via optional contact pad 551, which preferably comprises a metal. A voltage applied between contact pad 551 and contact pad 533 or 534 produces an attractive force between moveable comb teeth 542 and the teeth of stationary comb 531 or 532, respectively, that tends to cause micromirror 541 to move toward substrate 510. When a voltage is not applied, springs 543, 544, 545 and 546 tend to return micromirror 541 to its original position. Application of a voltage between contact pad 551 and both contact pads 533 and 534 simultaneously will tend to cause translational motion of micromirror 541, such that it tends to move toward, but remain parallel with, substrate 510.

The present invention encompasses a wide variety of MEMS devices, including but not limited to electrical switches, variable capacitors and inductors, high frequency resonators, and mircromirrors for optical scanning and switching. Various device types are distinguished by the design of the moveable functional element and some types of devices may require additional silicon features in the first device layer comprising the stationary comb structure. For example, the moveable functional element of a scanning micromirror typically has a flat surface to which a thin layer of metal (aluminum, for example) may be applied to increase the reflectivity. For scanning micromirrors, no additional features are typically required on the first device layer. On the other hand, an electrical switch typically would have a moveable functional element comprised of an armature with a metallized contact area near its end and would require a metallized contact pad with an electrical contact in the first device layer.

Features of the Invention

Key features of the device of the present invention that contribute to high device performance, reduced processing time and high process yield are use of a supporting substrate and metal bonds between device layers.

The supporting substrate enables the silicon device layers to be relatively thin (20–50 $\mu$m) so that silicon etch times are reduced from 3–5 hours for prior art procedures to 20–30 minutes, which increases throughput and reduces costs. Shorter etch times also increase the accuracy of the etch processes and enable use of thinner photoresists, which increases the resolution of the photolithographic process. In addition, the supporting substrate, which has device layers on only one side, protects devices from incidental damage during fabrication, handling and packaging.

The metal interlayer bonds of the device of the present invention can be formed by thermal compression bonding which for gold is an inexpensive low-temperature procedure (330° C. compared to >1000° C. for silicon-oxide-silicon bonding) that minimizes device stress and deformation of the actuator structures. The Au-Au bonding procedure also ensures proper electrical connections and is less sensitive to particulates so that bonding can be performed in a relatively inexpensive cleanroom (Class 1000, for example). Furthermore, use of metal interlayer bonds avoids the wet chemical oxide etch that is a primary cause of reduced device yield for prior art processes. Metal bonds also ensure that all structures other than the drive voltage contacts are properly connected and grounded, avoiding extra processing steps sometimes required for prior art processes.

High resolution and high precision for the device actuator structures of the present invention enables high device performance and high fabrication yield. As a result of the advantages discussed above, a resolution of 2 $\mu$m was demonstrated for micromirror devices of the present invention, whereas a resolution of only 4 $\mu$m is obtained for comparable prior art devices. The device of the present invention is also conducive to use of alignment marks on the first device layer to provide high precision alignment for the second device layer.

Fabrication of a Preferred Embodiment

Wafer-scale processing was used to fabricate MEMS scanning micromirror devices having square mirrors (200–500 $\mu$m square) with moveable comb actuator teeth (20–100 $\mu$m long, 2–5 $\mu$m wide and 1–5 $\mu$m spacing) on two opposing sides and torsion springs (1.5–5 $\mu$m wide and 100–1000 $\mu$m long) at the midpoints of the other two sides. Alignment marks were etched into the surface of a first silicon device layer (50–200 $\mu$m thick) on a first SOI wafer having a silicon oxide internal etch stop layer and a silicon supporting substrate (300–500 $\mu$m thick). A silicon oxide etch resistant layer (2500 Å thick) was applied by PECVD to the first silicon device layer and was patterned and etched to expose silicon contact pads (50–200 $\mu$m square), which were selectively metallized by vacuum evaporation of 150 Å Cr and 5000 Å Au, and liftoff of the remaining photoresist and extraneous metal. The etch resistant layer was then patterned again and the patterned oxide was removed by dry oxide plasma etching. This was followed by deep silicon plasma etching of the underlying silicon to form the stationary comb structure. The same Cr/Au metallization on the first silicon layer on the first wafer was applied to matching areas on a second silicon device layer (20 $\mu$m thick) on a second wafer having a silicon oxide internal etch stop layer and a silicon handle substrate (300–500 $\mu$m thick). The matching Cr/Au contacts on the two wafers were aligned and bonded together by thermal compression bonding (330° C. for one hour) and the silicon handle substrate and oxide etch stop layer on the second wafer were etched away (after lapping). Small areas (5000 $\mu$m square) on the second silicon layer were etched away to expose two alignment marks on the first silicon layer, which were used for precise alignment of the mask for patterning the second silicon layer. The second silicon layer was patterned and etched to form the moveable comb structure, micromirror, torsion spring and anchor/contact pads, and to expose the contact pads for the stationary comb. Electrical contacts were formed to the contact pads by gold wire bonding.

The micromirror devices of the present invention provided scanning over a 12° optical range and a mechanical angle of $^\pm3°$ at a high resonant frequency of 2.5 kHz with an operating voltage of only 20 VDC. For comparison, similar MEMS scanning micromirror devices with circular mirrors (550 μm diameter) were fabricated according to a prior art process (R. A. Conant, J. T. Lee, N. Y. Lau and R. S. Muller, p. 6, Proc. Solid-State and Actuator Workshop, Hilton Head Island, S.C., Jun. 4–8, 2000) involving a through-wafer deep silicon etch and wet chemical release. Under comparable scanning conditions, these prior art mirrors required an operating voltage in excess of 100 V, which is at least five times that for the present device. The process of the present invention also provided almost 100% yield of good devices.

I claim:

1. A micro-electro-mechanical system (MEMS) device, comprising:

a supporting substrate layer;

an electrically insulating layer disposed on said supporting substrate layer;

a stationary actuator comb disposed in a first device layer on said electrically insulating layer;

a first electrical contact to said stationary actuator comb;

at least one first bond pad disposed in the first device layer on said electrically insulating layer;

a moveable structure, including a functional device element and a moveable actuator comb, in a second device layer vertically about said first device layer;

at least one second bond pad in the second device layer;

a spring in the second device layer connecting said moveable structure to at least one second bond pad;

at least one metal bond whereby said first bond pad and said second bond pad are bonded together; and a second electrical contact to said moveable structure, such that a voltage applied between said first and second electrical contacts tends to cause the functional device element to move relative to said supporting substrate layer.

2. The device of claim 1, wherein the electrically insulating layer is comprised of silicon oxide.

3. The device of claim 1, wherein at least one layer of the group consisting of the supporting substrate layer, the first device layer, and the second device layer comprises silicon.

4. The device of claim 1, wherein at least one of the first and second electrical contacts comprises a metallic electrical contact pad.

5. The device of claim 4, wherein the metallic electrical contact pad comprises a gold layer and an adhesion layer, said adhesion layer comprising a metal selected from the group consisting of chromium, titanium, nickel and cobalt.

6. The device of claim 1, wherein at least one of said first and second electrical contacts comprises a wire bond.

7. The device of claim 1, wherein the functional device element is selected from the group consisting of scanning micromirror, optical switch, electrical switch, variable capacitor, variable inductor, and high frequency resonator.

8. The device of claim 1, wherein said metal bond comprises a gold layer and an adhesion layer, said adhesion layer comprising a metal selected from the group consisting of chromium, titanium, nickel and cobalt.

9. The device of claim 1, wherein said metal bond is formed by thermal compression bonding.

10. The device of claim 1, wherein said spring includes a torsion spring permitting rotational motion of the functional device element about the axis of the torsion spring.

11. The device of claim 1, wherein said spring further comprises a plurality of springs permitting translational motion of the functional device element.

12. A micro-electro-mechanical system (MEMS) device, comprising:

a silicon supporting substrate layer;

a silicon oxide electrically insulating layer disposed on said silicon supporting substrate layer;

a stationary actuator comb disposed in a first silicon device layer on said silicon oxide electrically insulating layer;

a first electrical contact to said stationary actuator comb;

at least one first silicon bond pad disposed in the first silicon device layer on said silicon oxide electrically insulating layer;

a moveable structure, including a functional device element and a moveable actuator comb, in a second silicon device layer vertically about said first device layer;

at least one second silicon bond pad in the second silicon device layer;

a silicon spring in the second silicon device layer connecting said moveable structure to at least one second silicon bond pad;

at least one metal bond whereby said first silicon bond pad and said second silicon bond pad are bonded together; and a second electrical contact to said moveable structure, such that a voltage applied between said first and second electrical contacts tends to cause the functional device element to move relative to said supporting substrate layer.

13. The device of claim 12, wherein at least one of the first and second electrical contacts comprises a metallic electrical contact pad.

14. The device of claim 13, wherein the metallic electrical contact pad comprises a gold layer and an adhesion layer, said adhesion layer comprising a metal selected from the group consisting of chromium, titanium, nickel and cobalt.

15. The device of claim 12, wherein at least one of said first and second electrical contacts comprises a wire bond.

16. The device of claim 12, wherein the functional device element is selected from the group consisting of scanning micromirror, optical switch, electrical switch, variable capacitor, variable inductor, and high frequency resonator.

17. The device of claim 12, wherein said metal bond comprises a gold layer and an adhesion layer, said adhesion layer comprising a metal selected from the group consisting of chromium, titanium, nickel and cobalt.

18. The device of claim 12, wherein said metal bond is formed by thermal compression bonding.

19. The device of claim 12, wherein said spring includes a torsion spring permitting rotational motion of the functional device element about the axis of the torsion spring.

20. The device of claim 12, wherein said spring further comprises a plurality of springs permitting translational motion of the functional device element.

21. A micro-electro-mechanical system (MEMS) device, comprising:

a silicon supporting substrate layer;

a silicon oxide electrically insulating layer disposed on said silicon supporting substrate layer;

a stationary actuator comb disposed in a first silicon device layer on said silicon oxide electrically insulating layer;

a first electrical contact to said stationary actuator comb;

at least one first silicon bond pad disposed in the first silicon device layer on said silicon oxide electrically insulating layer;

a moveable structure, including a functional device element and a moveable actuator comb, in a second silicon device layer vertically about said first device layer;

at least one second silicon bond pad in the second silicon device layer;

a silicon torsion spring in the second silicon device layer connecting said moveable structure to at least one second silicon bond pad;

at least one thermal compression gold bond whereby said first silicon bond pad and said second silicon bond pad are bonded together; and a second electrical contact to said moveable structure, such that a voltage applied between said first and second electrical contacts tends to cause the functional device element to move relative to said supporting substrate layer.

* * * * *